United States Patent
Chang

(10) Patent No.: US 6,602,805 B2
(45) Date of Patent: Aug. 5, 2003

(54) METHOD FOR FORMING GATE DIELECTRIC LAYER IN NROM

(75) Inventor: Kent Kuohua Chang, Taipei (TW)

(73) Assignee: Macronix International Co., Ltd. (TW)

(*) Notice: Subject to any disclaimer, the term of this patent is extended or adjusted under 35 U.S.C. 154(b) by 0 days.

(21) Appl. No.: 09/735,894

(22) Filed: Dec. 14, 2000

(65) Prior Publication Data

US 2002/0086548 A1 Jul. 4, 2002

(51) Int. Cl.[7] .................. H01L 21/31; H01L 21/469
(52) U.S. Cl. ........................ 438/785; 257/640
(58) Field of Search .................. 438/785; 257/410; 365/151; 252/406, 310

(56) References Cited

U.S. PATENT DOCUMENTS

| | | | |
|---|---|---|---|
| 5,828,080 A | * 10/1998 | Yano et al. | 257/310 |
| 6,020,243 A | * 2/2000 | Wallace et al. | 257/213 |
| 6,060,755 A | * 5/2000 | Ma et al. | 257/406 |
| 6,320,784 B1 | * 11/2001 | Muralidhar et al. | 365/151 |
| 6,407,435 B1 | * 6/2002 | Ma et al. | 257/406 |

* cited by examiner

*Primary Examiner*—William David Coleman

(57) ABSTRACT

In fabricating nitride read only memory, a zirconium oxide layer has high dielectric constant and a zirconium oxide layer is replaced conventional tunnel oxide layer. Zirconium oxide layer can increase coupling ratio of gate dielectric layer and reliability for nitride read only memory type flash memory is improved. This invention, a substrate is provided and a zirconium oxide layer is formed on substrate by reactive magnetron sputtering and a silicon nitride layer is sandwiched between a zirconium oxide layer and a silicon oxide layer. Then, an ONO layer (oxide-nitride-oxide layer) is formed. The method is using zirconium oxide as gate dielectric can reduce leakage current, increase drain current, improve subthreshold characteristics, and electron and hole mobilities.

7 Claims, 3 Drawing Sheets

METHOD FOR FORMING GATE DIELECTRIC LAYER IN NROM

BACKGROUND OF THE INVENTION

1. Field of the Invention

This present invention is generally relates to a method for forming gate dielectric layer in NROM (nitride read only memory) by using zirconium oxide layer to replace conventional silicon dioxide layer, and more particularly to a method for increasing gate controllability and good on and off characteristics.

2. Description of the Prior Art

Referring to FIG. 1, a typical prior art NROM cell is illustrated. This cell includes a substrate 100, an ONO (oxide-nitride-oxide) structure having a silicon nitride layer 122 sandwiched between two silicon oxide layers 120 and 124 formed thereon, and a polysilicon layer 150 formed on top of the ONO layer by using LPCVD (Low Pressure Chemical Vapor Deposition) method. Then, an etching step is performed to etch the polysilicon layer 150 and the ONO structure to form gate electrode and spacers 126 and 128 are then formed on the sidewall of gate electrode. Next, a source 101 and a drain 102 is implanted in the substrate 100.

For erasable programmable read only memory (EPROM), a cell includes a gate structure and a drain 102. A silicon oxide layer 120, which is the bottom layer of gate electrode, is thin enough to permit Fowler Nordheim tunneling (FN tunneling) occurred. Memory cell is therefore erased or programmed by FN tunneling through the bottom silicon oxide layer 120 which can be appeared as tunneling oxide layer. When in writing mode, gate electrode is grounded while the drain 102 is connected a high voltage. When in erasing mode, gate electrode is connected to a high voltage, while the drain 102 is grounded.

According to the hot electron injection phenomenon (HEI), some hot electrons penetrate through the bottom silicon oxide layer 120, especially when silicon oxide layer 120 is thin enough, and electrons are therefore collected in silicon nitride layer 122. As known in the art, the received charge retained in silicon nitride layer 122 is concentrated in the region adjacent to drain 102.

The conventional method for forming the tunneling oxide layer 120 is to form a silicon oxide layer on the substrate by thermal oxidation. However, the dielectric constant value of silicon dioxide is between about 3.8 to 3.9 and thermal oxidation is a high temperature process. Moreover, the gate dielectric layer has low coupling ratio and if we introduce high voltage to gate electrode/drain to erase/program the cell more than 100 times, tunneling oxide layer 120 is easily breakdown, leakage current is increased, and reliability of tunneling oxide layer 120 is decreased.

SUMMARY OF THE INVENTION

In accordance with this present invention, a method for forming a gate dielectric layer in NROM is provided, wherein a zirconium oxide layer replaces for conventional tunneling oxide layer.

It is a first object of this invention to deposit a zirconium oxide layer on the substrate by sputtering deposition method having lower process temperature than conventional thermal oxidation such that thermal budget can be reduced.

It is another object of this present invention that high coupling ratio gate dielectric layer formed on the substrate.

It is a further object of this present invention that high dielectric constant zirconium oxide layer formed on the substrate can reduce control voltage and increase current drivability, exhibit low subthreshold swing and well on/off characteristics.

It is still another object of this present invention that high coupling ratio of gate dielectric layer can be improved, and defect density of memory cell is reduced, and reliability of flash memory device can be improved.

In accordance to the above objects, in one embodiment for this present invention for the most part is to form a gate dielectric layer in NROM. The gate structure is constructed by a substrate and a zirconium oxide layer is formed on the substrate and a silicon nitride layer is sandwiched between the zirconium oxide layer and a silicon oxide layer. Then, a polysilicon layer is formed on silicon oxide layer and a defined photoresist layer is formed on the polysilicon layer. Further, the polysilicon layer, silicon oxide layer, silicon nitride layer and zirconium oxide layer are subsequently etched to form gate electrode. Next, a source and a drain are formed inside the substrate by using conventional ion implantation method.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
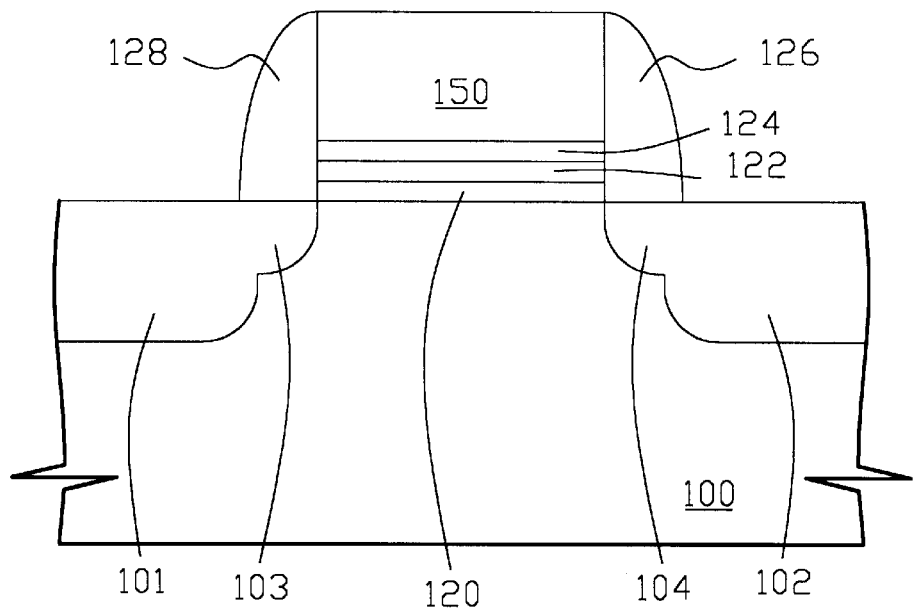
FIG. 1 is a cross-sectional view of a semiconductor device is illustrating the conventional gate dielectric layer in NROM.
Figure 2:
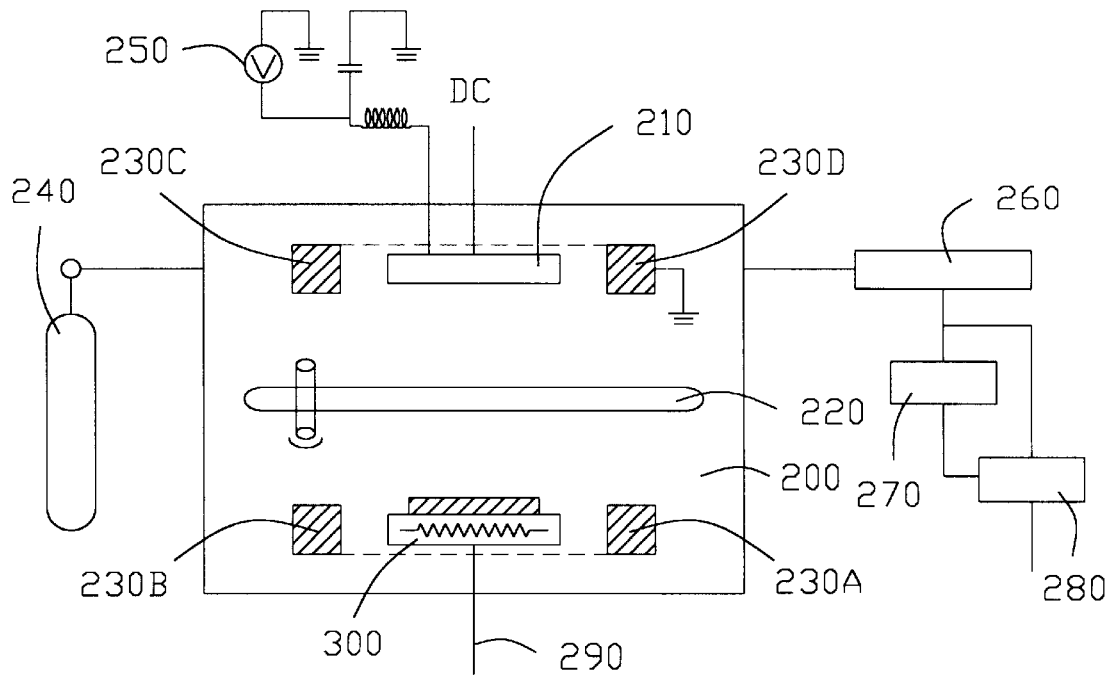
FIG. 2 is a schematic diagram employing an apparatus used in manufacturing dielectric layer method.

Reference to FIG. 2, a DC sputtering system is illustrated. A sputtering chamber 200 is constructed by an anode electrode provided by a metal target 210, a wafer holder 300 (can be grounded) and a shield 220. Gas for providing plasma and sputtering is provided form gas supply 240 in one end of the chamber 200, and introduced to pump 280 in another end of the chamber 200. The energy that plasma needs to operate is provided by a DC power 250.

In order to make positive ions in plasma bombard surface of metal target 210, electrode placed on metal target 210 will connect to anode with DC power supply 250. Because tolerance of sputtering, such as oxygen and water, in metal sputtering is low, pressure in chamber 200 is lowered to take out the impurities that have strong oxidation by using cryopump 270 before performing metal sputtering. This pre-sputtering is called base pressure, usually $10^{-6}$ or $10^{-7}$ torr.

When the chamber 200 is arrived at base pressure, reactive gas is then introduced to perform metal sputtering. Before performing sputtering surface of the metal target 210. In order to prevent these impurities from sputtering into the deposited film to affect alloy, the shield 220 is used to separate metal target 210 from wafer to such that the initial deposition is covered by the shield 220 in the initial sputtering. This shield 220 will be removed until the condition of metal target' surface 210 is stable to perform metal sputtering.

Zirconium target 210 is connected to the DC power supply 250 with about 100 to 400 watts to ionize zirconium target within total pressure about 40 mtorr in the chamber 200. Argon in the chamber 200 is used as inert gas, and oxygen is introduced into the chamber 200 with the ionized to a zirconium oxide layer 20 on the substrate 10. The dielectric constant of zirconium oxide layer is about 25, and the thickness of this zirconium layer is between about 20 to 70 angstroms. The depositing temperature is between about 250 to 450° C., and depositing pressure is between about 20 to 70 mtorr. After the zirconium oxide layer 20 is formed on the substrate 10, the wafer is moved to out of the chamber 200 and performed a rapid thermal annealing step to the zirconium oxide layer 20. The duration of this annealing step is between about 20 to 50 seconds and annealing temperature is between about 650 to 1000° C. in 40 mtorr ambient. The object of this annealing process is to reduce defect densities and leakage currents of zirconium oxide layer 20 that better TDDB (Time-Dependent Dielectric Breakdown) characteristic is provided. FIG. 2 is to introduce a method for forming a zirconium oxide layer. However, the other sputtering methods such as reactive magnetron sputtering can be applied to this prevent invention.

Figure 3:
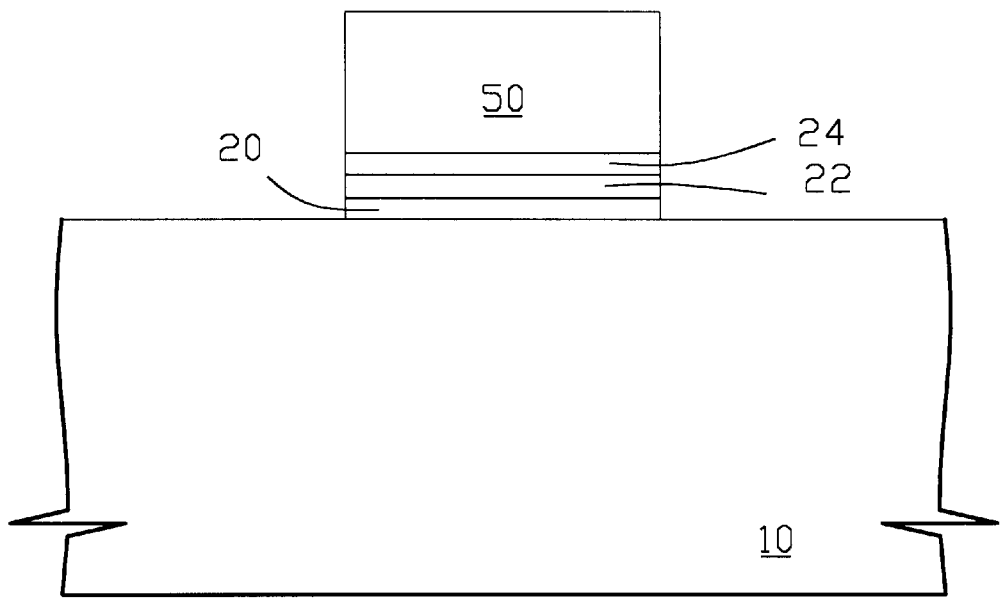
FIG. 3 is a cross-sectional view of a semiconductor device in accordance with this invention illustrating the steps of forming gate dielectric layer on substrate.

Referring to FIG. 3, a silicon nitride layer 22 is deposited on the zirconium oxide layer 20. This silicon nitride layer 22 is used as a conventional floating gate to storage charge. The silicon nitride layer 20 can be formed by using conventional LPCVD (Low Pressure Chemical Vapor Deposition) method or PECVD (Plasma Enhanced Chemical Vapor Deposition) method on the zirconium oxide layer 20. The process temperature of LPCVD method is between about 650 to 800° C. However, the PECVD method is perfect because the depositing temperature is between about 250 to 400° C., and thickness of this silicon nitride layer 22 is between about 20 to 180 angstroms. The precursors of PECVD silicon nitride are silane, TEOS (Tetra-Ethyl-Ortho-Silicate), oxygen and nitrous oxide. Then, a silicon oxide layer 24 is deposited on the silicon nitride layer 22 by using conventional CVD method.

Next, a polysilicon layer 50 is deposited on the silicon oxide layer 24 by using conventional LPCVD method, in which the polysilicon layer 50 is formed by decomposed and heating silane. The temperature of forming polysilicon layer 50 is between about 600 to 650° C., reactive pressure is about hundreds mtorr. The thickness of this polysilicon layer 50 is between about 800 to 2000 angstroms. Then, patterned photoresist layer is formed on the polysilicon layer 50 in which this patterned pattern is gate. Next, the polysilicon layer 50, silicon oxide layer 24, silicon nitride layer 22, and the zirconium oxide layer 20 is subsequently etched by using the defined photoresist layer as a mask to form gate electrode structure, and the photoresist layer is then removed.

Figure 4:
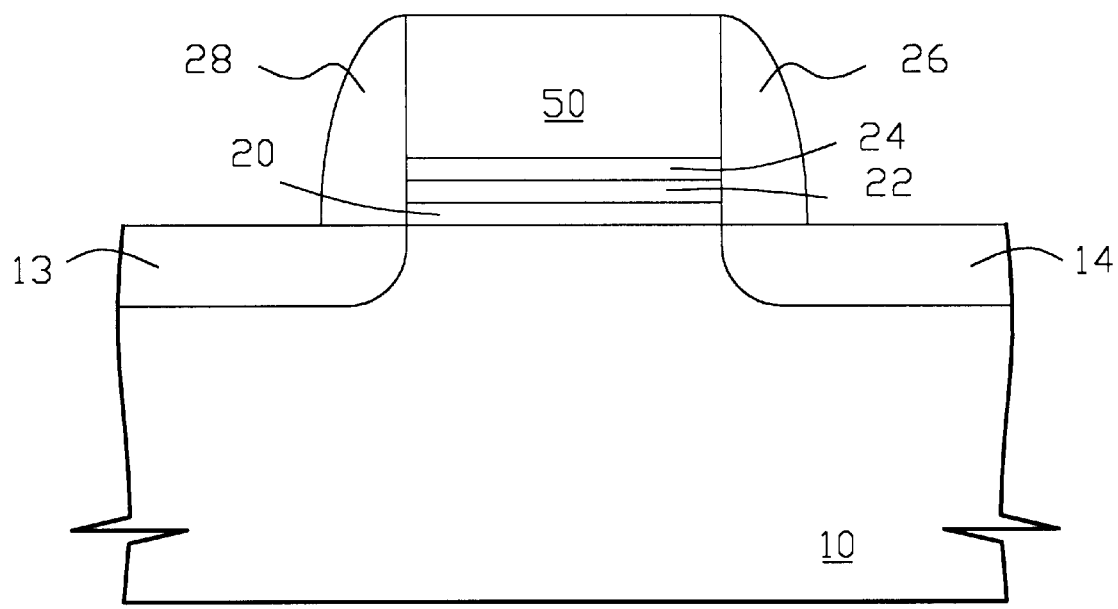
FIG. 4 is a cross-sectional view of a semiconductor device in accordance with this invention illustrating the step of forming spacers on sidewall of gate.

Referring to FIG. 4, LDD (Lightly-Doped Drain) region 13 and 14 are formed in the substrate 10 by ion-implantation. Then, a conformal silicon oxide layer is deposited on the substrate 10 and the gate electrode structure. This wafer capped with the conformal silicon oxide layer is anisotropically etched to form spacer on the sidewall of the gate electrode structure. Because this anisotropical etching step will etch the thickness of deposited silicon oxide, silicon oxide layer on the sidewall of gate electrode structure is thicker than other place and will not be removed after etching process. Spacers 26 and 28 are therefore formed on the sidewall of gate electrode structure.

Figure 5:
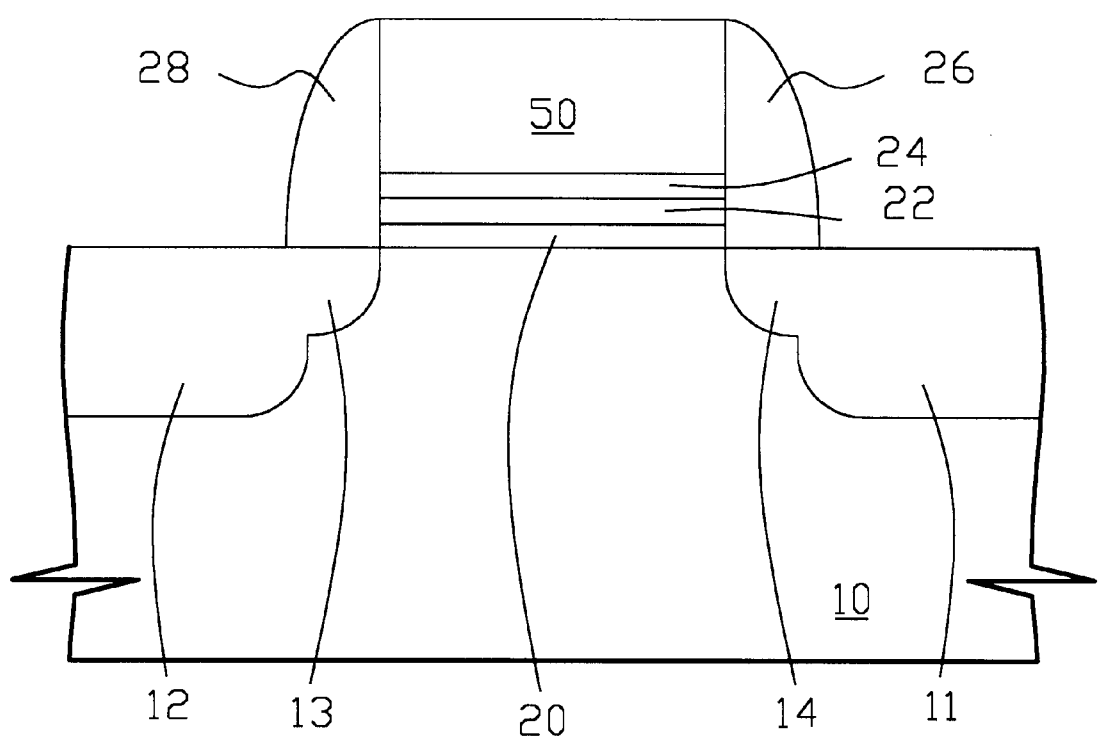
FIG. 5 is a schematic representation of gate dielectric layer in NROM in accordance with this invention.

Then, referring to FIG. 5, using all gate electrode structure and spacers as a mask, source region 11 and drain region 12 are formed by using ion-implantation. This implantation is heavy doping and phosphorus or high solid solubility arsenic can be ions to perform implantation with higher dose and deepen depth. The dose of this implantation is about $10^{15}$ per $cm^2$.

In this preferred embodiment, a zirconium oxide layer as tunneling oxide layer is provided. Because this zirconium oxide layer is formed sputtering method, process temperature is lower than the conventional thermal oxidation method, and thermal budget is therefore decreased. Moreover, control voltage can be decreased due to high dielectric constant of zirconium oxide. Further, high coupling integrity of tunnel oxide, so reliability of flash memory is improved.

Although specific embodiments have been illustrated and described it will be obvious to those skilled in the art that various modifications may be made without departing from what is intended to be limited solely by the appended claims.

What is claimed is:

1. A method for forming nitride read only memory, said a method comprising:

providing a substrate;

forming a zirconium oxide layer on said substrate by using sputtering method;

performing annealing treatment to said zirconium oxide layer;

forming a silicon nitride layer on said zirconium oxide layer;

forming a silicon oxide layer on said silicon nitride layer;

forming a polysilicon layer on said silicon oxide layer;

forming a photoresist over said polysilicon layer and defining a gate pattern on said photoresist;

etching said polysilicon layer, said silicon oxide layer, said silicon nitride layer, and said zirconium oxide layer to form gate electrode by using said photoresist as a mask;

removing said photoresist;

forming a spacer on sidewall of said gate electrode; and forming a source and a drain in said substrate.

2. The method according to claim 1, wherein said sputtering method comprises a reactive magnetron sputtering method.

3. The method according to claim 1, wherein temperature for forming said zirconium oxide layer is between about 200 to 800 degree centigrade.

4. The method according to claim 1, wherein thickness of said zirconium oxide layer is between about 20 to 70 angstrom.

5. The method according to claim 1, wherein said annealing temperature is between about 650 to 1000 degree centigrade and duration is between about 20 to 50 seconds.

6. The method according to claim 1, wherein said treatment environment is noble gas.

7. The method according to claim 1, wherein a neutral treatment environment is selected from the group consisting of Ar, $N_2$ and NO.

* * * * *